United States Patent
Park et al.

(10) Patent No.: US 7,944,130 B2
(45) Date of Patent: May 17, 2011

(54) MULTI-CANTILEVER MEMS SENSOR, MANUFACTURING METHOD THEREOF, SOUND SOURCE LOCALIZATION APPARATUS USING THE MULTI-CANTILEVER MEMS SENSOR, SOUND SOURCE LOCALIZATION METHOD USING THE SOUND SOURCE LOCALIZATION APPARATUS

(75) Inventors: Youngjin Park, Daejeon (KR); Youn-Sik Park, Daejeon (KR); Jin-Young Kim, Daejeon (KR); Hyun Jo, Daejeon (KR); Seung Seob Lee, Daejeon (KR); Yong Chul Kim, Daejeon (KR)

(73) Assignee: Korea Advanced Institute of Science and Technology, Yusung-Gu, Daejeon (KR)

( * ) Notice: Subject to any disclaimer, the term of this patent is extended or adjusted under 35 U.S.C. 154(b) by 252 days.

(21) Appl. No.: 12/189,544

(22) Filed: Aug. 11, 2008

(65) Prior Publication Data
US 2009/0079298 A1 Mar. 26, 2009

(30) Foreign Application Priority Data

May 9, 2008 (KR) ........................ 10-2008-0043222

(51) Int. Cl.
*H01L 41/04* (2006.01)
(52) U.S. Cl. ........................................ 310/370; 310/317
(58) Field of Classification Search .................. 310/320, 310/321, 338, 339, 370, 317
See application file for complete search history.

(56) References Cited

U.S. PATENT DOCUMENTS

| 6,223,601 | B1 * | 5/2001 | Harada et al. ................... 73/649 |
| 6,651,504 | B1 * | 11/2003 | Datskos ......................... 73/651 |
| 2002/0139190 | A1 | 10/2002 | Daraktchiev et al. ........... 73/529 |
| 2002/0174715 | A1 * | 11/2002 | Kim et al. ....................... 73/105 |
| 2009/0052687 | A1 * | 2/2009 | Schwartz ........................ 381/92 |

FOREIGN PATENT DOCUMENTS

JP 2001-133322 * 5/2001

OTHER PUBLICATIONS

Machine translation of JP 2001-133322 generated from the website of the Japanese Patent Office.*
Kim et al., "Sound Source Localization Piezoresistive Multi-Cantilever Microphones", IEEE Sensors 2007 Conference, 2007, pp. 780-783.

* cited by examiner

*Primary Examiner* — Derek J Rosenau
(74) *Attorney, Agent, or Firm* — Allen, Dyer, Doppelt, Milbrath & Gilchrist, P.A.

(57) ABSTRACT

Disclosed herein is a multi-cantilever MEMS sensor functioning as a mechanical sensor having a plurality of cantilevers, replacing a conventional DSP based sound source localization algorithm and reducing production cost when the MEMES sensor applied to mass-produced robots, a manufacturing method thereof, a sound source localization apparatus using the multi-cantilever MEMS sensor and a sound source localization method using the sound source localization apparatus. The multi-cantilever MEMS sensor comprises a plurality of cantilevers 100 each of which includes a piezoresistor 20 and a sensing part 30 for sensing a predetermined signal generated according to the piezoresistor 20; and a terminal T for detecting the signal generated according to the piezoresistor 20, wherein one end of each cantilever is a free end and the other end thereof is a fixed end of each cantilever, the piezoresistor 20 and the sensing part 30 are formed at the fixed end, and the free ends of the plurality of cantilevers 100 have different lengths. A method of manufacturing the multi-cantilever MEMS sensor is provided. Furthermore, a method of using the multi-cantilever MEMS sensor and a sound source localization apparatus are provided.

2 Claims, 9 Drawing Sheets

MULTI-CANTILEVER MEMS SENSOR, MANUFACTURING METHOD THEREOF, SOUND SOURCE LOCALIZATION APPARATUS USING THE MULTI-CANTILEVER MEMS SENSOR, SOUND SOURCE LOCALIZATION METHOD USING THE SOUND SOURCE LOCALIZATION APPARATUS

BACKGROUND OF THE INVENTION

1. Field of the Invention

Sound source localization provides important information on positions of voices of speakers while people are increasingly interested in Human-robot interaction worldwide. The present invention relates to multi-cantilever MEMS (Micro-Electro-Mechanical System) sensor functioning as a mechanical sensor having a plurality of cantilevers, replacing a conventional DSP (Digital Signal Processor) based sound source localization algorithm and reducing production cost when the MEMS sensor applied to mass-produced robots, a manufacturing method thereof, a sound source localization apparatus using the multi-cantilever MEMS sensor and a sound source localization method using the sound source localization apparatus.

2. Background of the Related Art

A method using time delay of arrival (TDOA) between microphones, a method using a head related transfer function database of a platform, a beam forming method using a plurality of microphone arrays and so on are used for sound source localization.

A conventional sound source localization method measures the sound pressure of a sound according to a plurality of microphones in real time when the sound source is radiated to a three-dimensional space and performs post-processing on the measured sound pressure to localize the sound source position. When the sound source position is localized using the aforementioned method, a DSP chip is required to apply the post-processing to cases other than a PC environment. When the DSP chip is used, lots of computations are required for sound source localization to thereby result in an increase in system costs.

Furthermore, a procedure of performing the post-processing using a DSP chip while collecting information on the sound pressure measured in real time needs considerable buffering.

SUMMARY OF THE INVENTION

Accordingly, the present invention has been made in view of the above-mentioned problems occurring in the prior art, and it is a primary object of the present invention to provide a multi-cantilever MEMS sensor capable of localizing a sound source position, which does not uses a DSP chip so as to reduce the manufacturing cost and improve a data processing speed, a manufacturing method thereof, a sound source localization apparatus using the multi-cantilever MEMS sensor and a sound source localization method using the sound source localization apparatus.

To accomplish the above object of the present invention, in one aspect, the present invention provides a multi-cantilever MEMS sensor comprising: a plurality of cantilevers 100 each of which includes a piezoresistor 20 and a sensing part 30 for sensing a predetermined signal generated according to the piezoresistor 20; and a terminal T for detecting the signal generated according to the piezoresistor 20, wherein one end of each cantilever is a free end and the other end thereof is a fixed end of each cantilever, the piezoresistor 20 and the sensing part 30 are formed at the fixed end, and the free ends of the plurality of cantilevers 100 have different lengths.

The piezoresistor 20 may comprise boron.

An electrode pattern of the sensing part 30 or the terminal T may be formed through lithography.

To accomplish the above object of the present invention, in another aspect, the present invention also provide a method of manufacturing a multi-cantilever MEMS sensor, comprising: a cleaning step of cleaning a substrate 99 consisting of a first silicon layer 14, an insulating layer 12 and a second silicon layer 10; a first oxide layer forming step of forming a first oxide layer 16 on the substrate 99; a sensing part groove forming step of etching the first oxide layer 16 to form a sensing part groove 18; a growing step of growing a piezoresistor 20 in the sensing part groove 18; a second oxide layer forming step of forming a second oxide layer 22 on the substrate 99; a first bulk etching step of bulk-etching the bottom of the substrate 99 to form a support 10a; an oxide layer removal step of removing predetermined portions of the first and second oxide layers 16 and 22 other than portions 16a and 22a of the first and second oxide layers, which correspond to the sensing part groove 18, and the insulating layer 12; an electrode pattern forming step of forming a terminal T and a sensing part 300 on the substrate 99; and a free end forming step of etching the side of the first silicon layer 14, opposite to the sensing part 30, to form a free end.

The method of manufacturing a multi-cantilever MEMS sensor may further comprise a cutting step of cutting the substrate including a plurality of cantilevers 100 and a second bulk etching step of bulk-etching the bottom of the substrate between the first bulk etching step and the oxide layer removal step.

The cleaning step is performed according to the order represented in the following Table 1.

The first oxide layer 16 may be $SiO_2$.

The sensing part groove forming step may etch the first oxide layer using fluorine oxide.

The second oxide layer 22 may be formed by oxidizing silicon through low temperature oxidation.

The first bulk etching step may perform a directional etching process using TMAH solution.

The directional etching process may determine the size of a mask used during the etching according to the following Equation 1 and perform the etching using the mask.

The oxide layer removal step may dip a portion of the substrate other than the portions 16a and 22a of the first and second oxide layers corresponding to the sensing part groove 18 in a BHF solution to remove the predetermined portion of the first and second oxide layers 16 and 22 and the insulating layer 12.

The free end forming step may use reactive ion etching.

To accomplish the above object of the present invention, in still another aspect, the present invention also provides a sound source localization apparatus using a multi-cantilever MEMS sensor, comprising: at least two multi-cantilever MEMS sensors 210 comprising a plurality of cantilevers 100 each of which includes a piezoresistor 20 and a sensing part 30 for sensing a predetermined signal generated according to the piezoresistor 20; and a terminal T for detecting the signal generated according to the piezoresistor 20, wherein one end of each cantilever is a free end and the other end thereof is a fixed end of each cantilever, the piezoresistor 20 and the sensing part 30 are formed at the fixed end, and the free ends of the plurality of cantilevers 100 have different lengths; an electric circuit 220 for detecting signals generated from corresponding cantilevers of the multi-cantilever MEMS sensors 210 and counting a TDOA from a sound source 1 to the at least two multi-cantilever MEMS sensors; and a position estimator 230 for localizing the position of sound source 1 from the TDOA.

The electric circuit may comprise: a signal amplifier 222 for amplifying the signals generated from the corresponding cantilevers of the multi-cantilever MEMS sensors to a predetermined level; a filter 224 for removing noise from the amplified signals; and a trigger 226 for processing the noise-free signals into square-wave signals.

To accomplish the above object of the present invention, in still yet another, the present invention also provides a sound source localization method using at least two multi-cantilever MEMS sensors 210 and 210', comprising: a signal generating step S100 in which corresponding cantilevers 100n and 100n' among a plurality of cantilevers of the respective multi-cantilever MEMS sensors 210 and 210' generate signals according to a sound pressure variation; a TDOA extracting step S200 in which an electric circuit 220 processes the generated signals to counted digital sequence of a TDOA; and a localization step S300 in which a position estimator 230 localizes a position of sound source 1 from the TDOA.

The sound source localization method may further comprise a compensation step S250 of subtracting or adding a phase difference between the corresponding cantilevers 100n and 100n', which are previously stored in a database, from or to the counted TDOA between the TDOA extracting step S200 and the localization step S300.

The multi-cantilever MEMS sensor, the manufacturing method thereof and a sound source localization sensor according to the present invention have the following advantages.

The multi-cantilever MEMS sensor according to the present invention has a processing speed higher than a conventional method and reduces the manufacturing cost in mass production. Furthermore, additional post-processing is not required, and thus a data collecting process is omitted. Accordingly, sound source localization irrespective of buffering can be performed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Preferred embodiments of the present invention will be explained with reference to attached drawings.

<Configuration of a Multi-Cantilever MEMS Sensor>

Figure 1:
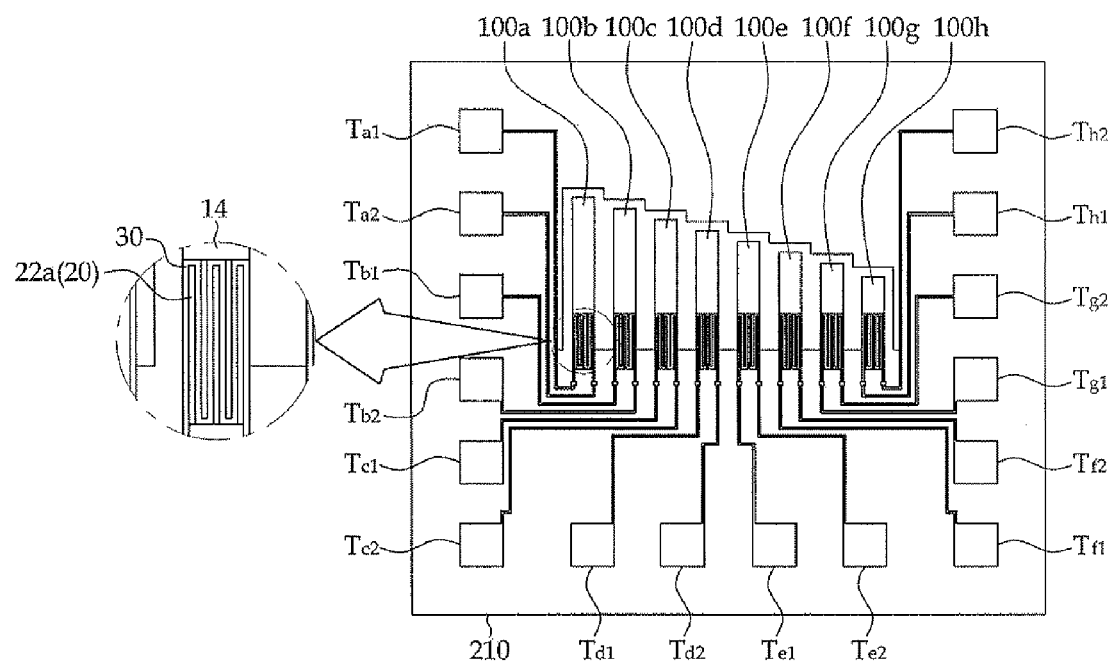
FIG. 1 is a front view of a multi-cantilever MEMS sensor according to the present invention.
Figure 2:
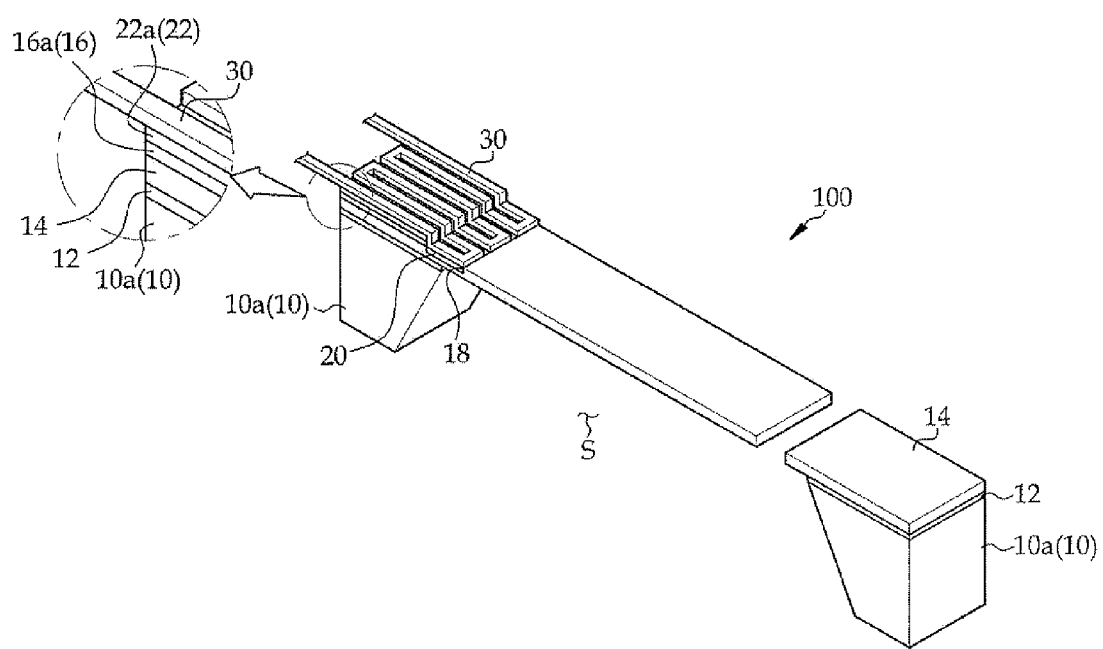
FIG. 2 is a perspective view of a cantilever.

FIG. 1 is a plan view of a multi-cantilever MEMS sensor according to the present invention and FIG. 2 is a perspective view of a cantilever 100. The multi-cantilever MEMS sensor includes a plurality of cantilevers (referred to as a cantilever group hereinafter) including terminals $T_{a1}, T_{a2}, T_{b1}, \ldots, T_{h1}$ and $T_{h2}$ for detecting electric signals. The cantilever group means a plurality of cantilevers 100 having different lengths. Although the multi-cantilever MEMS sensor includes eight cantilevers 100a, 100b, 100c, 100d, 100e, 100f, 100g and 100h in the present invention, the number of multi-cantilevers is not limited to eight. More cantilevers 100 having different free ends make the sound source localization more facilitated.

One end of the cantilever 100 is fixed to a substrate and the other end is a free end. The fixed end of the cantilever 100 has a sensing part groove 18 in which a piezoresistor 20 is grown and a sensing part 30 is formed thereon. The free end of the cantilever 100 vibrates according to a sound pressure variation.

Each cantilever 100 of the cantilever group has two terminals $T_{a1}$ and $T_{a2}, T_{b1}$ and $T_{b2} \ldots, T_{h1}$ and $T_{h2}$ for detecting a predetermined signal generated according to the piezoresistor 20, sensed by the sensing part 30.

<Method of Manufacturing a Multi-Cantilever MEMS Sensor>

A method of manufacturing a multi-cantilever MEMS sensor according to the present invention is explained with reference to FIGS. 3a through 3j.

Figure 3A:
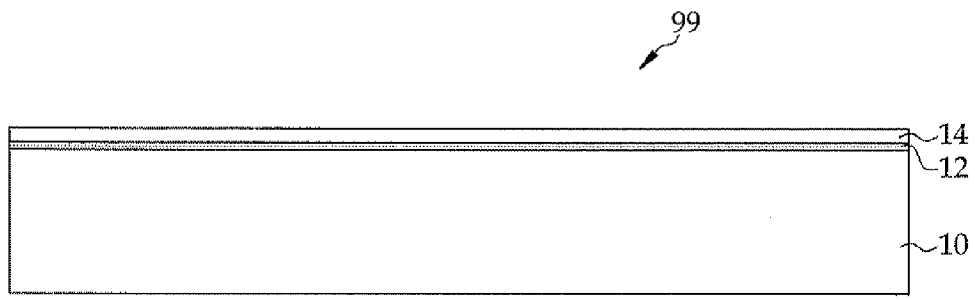
FIGS. 3a through 3j are cross-sectional views illustrating a method of manufacturing a multi-cantilever MEMS sensor according to the present invention.

First of all, a substrate 99 is cleaned (S10). The substrate used in the present invention includes an insulating layer 12 formed between first and second semiconductor layers 10 and 14, as illustrated in FIG. 3a. Preferably, an SOI (Silicon On Insulator) wafer including silicon oxide $SiO_2$ formed between a first silicon layer 14 and a second silicon layer 10 as the insulating layer 12 is used. The thickness of the SOI wafer is selected in consideration of the thickness of the first silicon layer 14 which will become the cantilever 100.

The substrate 99 is cleaned in order to improve performance and increase yield through removal of contaminants. It is preferable to clean the substrate 99 according to the order represented in Table 1.

TABLE 1

| Order | Method (mixture ratio and temperature) | Time |
| --- | --- | --- |
| Piranha (spm, $H_2SO_4$ clean) | $H_2SO_4:H_2O_2 = 2:1$ | 15 minutes |
| DI clean | | 3 minutes |
| DHF (Diluted HF) | $HF:H_2O = 1:150, 25°$ C. | 10 seconds |
| DI clean | | 30 seconds |
| SC1 (Standard Clean-1, APM) | $NH_4OH:H_2O_2:H_2O = 1:1:5, 75°$ C. | 5 minutes |
| DI clean | | 5 minutes |
| DHF (Diluted HF) | $HF:H_2O = 1:150, 25°$ C. | 15 seconds |
| DI clean | | 30 seconds |
| SC2 (Standard Clean-2, HPM) | $HCl:H_2O_2:H_2O = 1:1:6, 75°$ C. | 10 minutes |

TABLE 1-continued

| Order | Method (mixture ratio and temperature) | Time |
| --- | --- | --- |
| DI clean | | 20 seconds |
| DHF (Diluted HF) | HF:H$_2$O = 1:50, 25° C. | 10 seconds |
| DI clean | | 30 seconds |

Figure 3B:
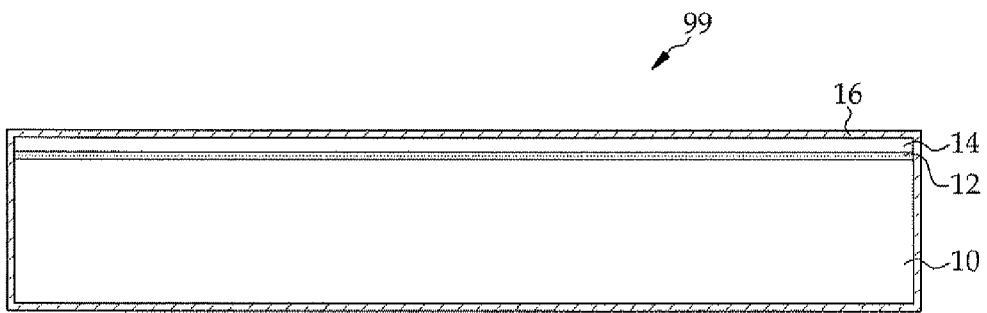
Figure 3C:
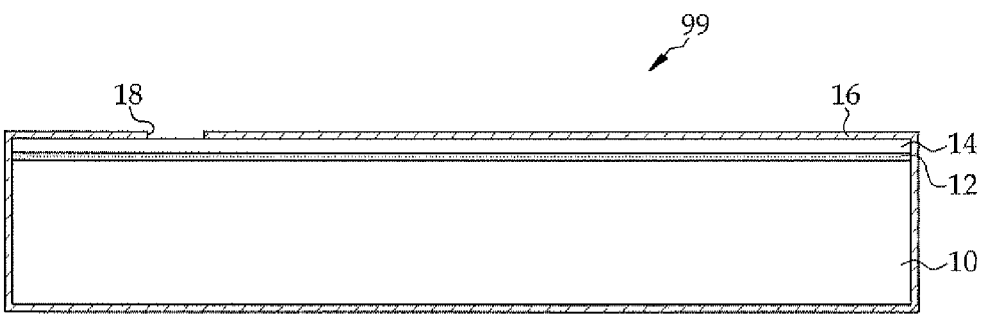

Then, a first oxide layer 16 is formed on the outer face of the cleaned substrate (S20). As illustrated in FIG. 3b, the first oxide layer 16 protects the substrate from the following processes and is formed using SiO$_2$, preferably.

Subsequently, the sensing part groove 18 is formed (S30). The sensing part groove 18 is filed with the piezoresistor 20 for the purpose of measuring mechanical vibration of cantilevers. As illustrated FIG. 3c, a predetermined portion of the surface of the substrate is etched using HF to form the sensing part groove 18.

Figure 3D:
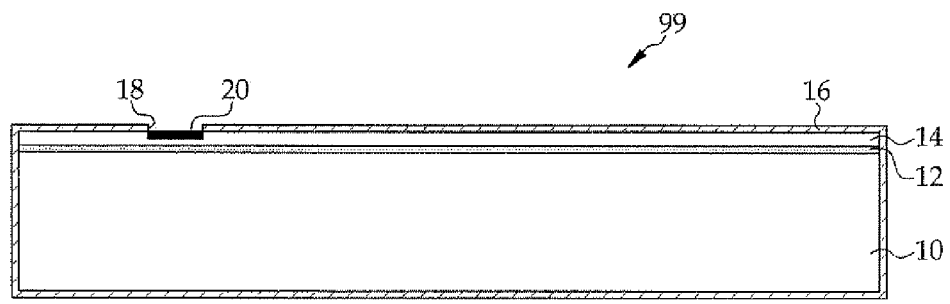

The piezoresistor 20 is formed through doping (S40). A well-known material can be used as a piezoresistive material of the piezoresistor 20. Preferably, boron (B) is used as the piezoresistive material. As illustrated in FIG. 3d, boron ions are doped into the sensing part groove 18 to grow the piezoresistor 20 in the sensing part groove 18.

Figure 3E:
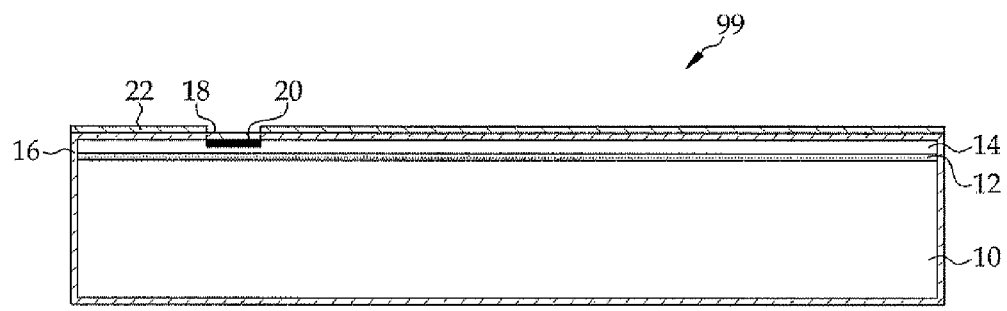

Referring to FIG. 3e, a second oxide layer 22 is formed (S50). The second oxide layer 22 protects the substrate in a first bulk etching step which will be explained later. The second oxide layer 22 is formed through PECVD or LTO (Low Temperature Oxidation). When the first bulk etching step uses TMAH solution, LTO is used because PECVD is vulnerable to a base.

Figure 3F:
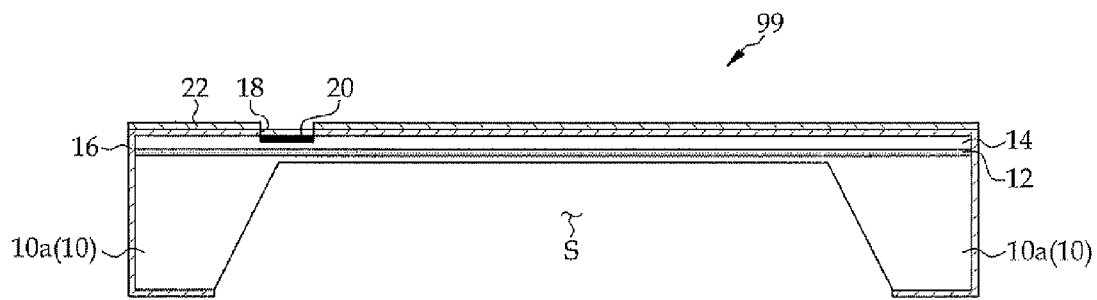
Figure 3G:
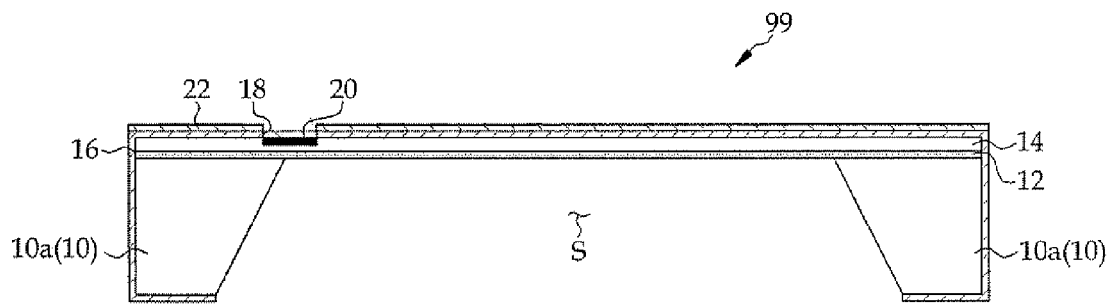

Referring to FIG. 3f, the first bulk etching step using wet etching is performed (S60). Preferably, the bottom of the substrate, that is, the second silicon layer 10 is dipped in TMAH solution to form a support 10a. Then, a space S is formed at the bottom of the substrate according to the first bulk etching. The space S is a region for vibration of the free end of the cantilever 100. When the second silicon layer 10 is dipped in the TMAH solution, the second silicon layer 10 is etched with etching directivity. The size of the to-be-etched portion of the second silicon layer 10 can be estimated because the directivity of the silicon layer is used. Accordingly, a predetermined mask can be fabricated and used. Silicon has directivity of approximately 54.74 degrees in (100) direction. Thus, Equation 1 can be used as follows:

$$W_m = W_o + 2 \cot an(54.74°) z \quad \text{[Equation 1]}$$

Here, $W_m$ represents the size of a mask to be used during the etching, $W_o$ represents the size of a to be-etched portion of the substrate, and z denotes the thickness of the to-be-etched substrate.

The first bulk etching is performed on the second silicon layer 10 corresponding to the bottom face of the substrate, as illustrated in FIG. 3f. When the substrate is dipped in the TMAH solution for approximately 10 hours, etching is automatically stopped by the insulating layer 12 corresponding to the middle layer of the substrate.

After the first bulk etching step (S60), the substrate is cut into a desired size (S62), and then a second bulk etching step (S64) is carried. The second bulk etching step completely removes the remainder of the second silicon layer 10, which is not eliminated by the first bulk etching step. The second bulk etching is automatically stopped by the insulating layer 12 (silicon oxide layer) of the substrate. The substrate cutting step and the second bulk etching step are performed for efficient mass production.

Figure 3H:
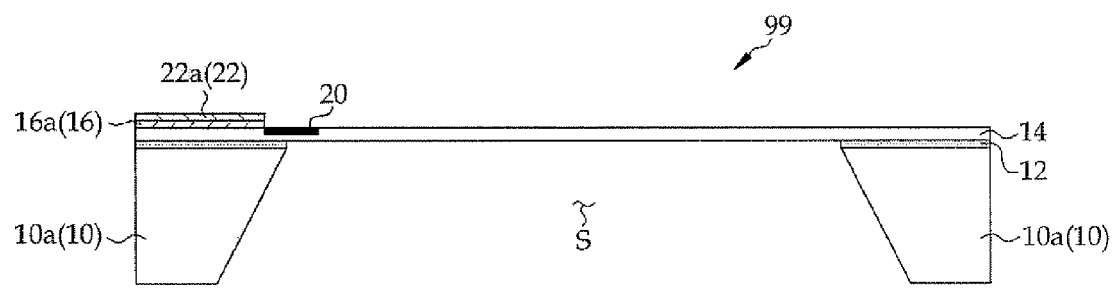
Figure 3I:
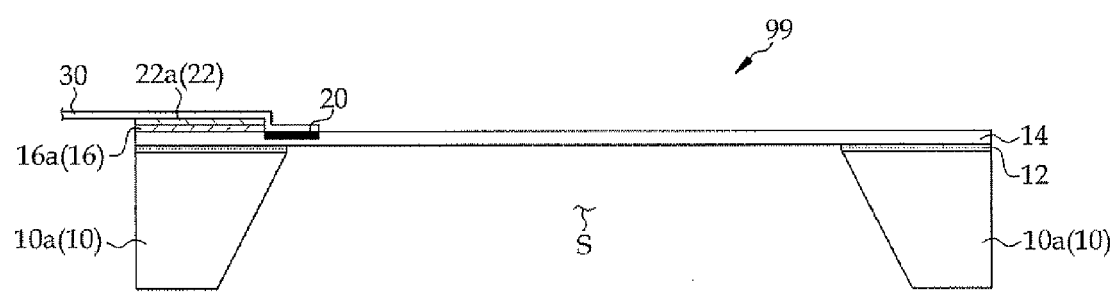

Referring to FIG. 3h, the substrate is dipped in a BHF solution for approximately 10 seconds to remove the first and second oxide layers 16 and 22 and the insulating layer 12 (silicon oxide layer) (S70). Here, portions of the first and second oxide layers 16 and 22, which correspond to the fixed end at which the sensing part groove 18 is formed, are left. When predetermined portions of the first and second oxide layers 16 and 22 and the insulating layer 12 are removed, only the first silicon layer 14 of the substrate is left. The multi-cantilever group is formed on the first silicon layer 14.

Figure 3J:
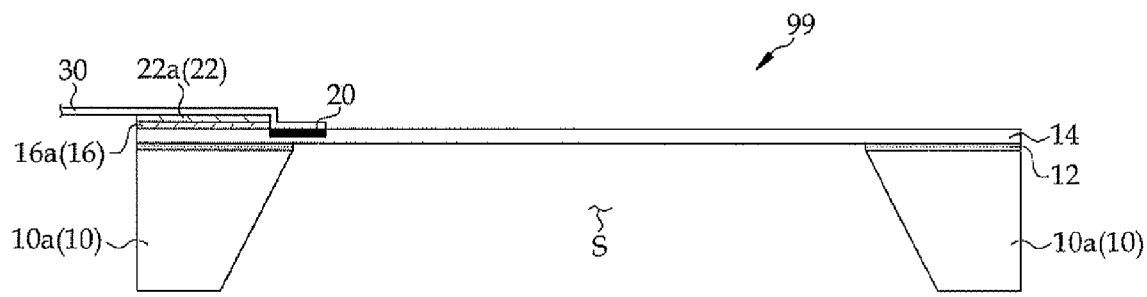

Subsequently, an electrode pattern is formed (S80). Since the present invention uses a piezoresistive method which induces a resistance variation according to a mechanical stress variation to detect a signal, the electrode pattern for detecting the signal, that is, the sensing part 30 or/and the terminal T is formed, as illustrated in FIG. 3j. The electrode pattern is formed using lithography.

Then, the side of the substrate, opposite to the fixed end at which the sensing part 30 is formed, is dry-etched to form the free end of the cantilever 100, as illustrated in FIG. 3j (S90). Here, it is preferable to use RIE (Reactive Ion Etching) as a dry etching method. Since a plurality of cantilevers are formed, a plurality of free ends are formed. Here, the respective free ends of the plurality of cantilevers have different lengths.

<Sound Source Localization Apparatus Using MEMS Sensors>

Figure 4:
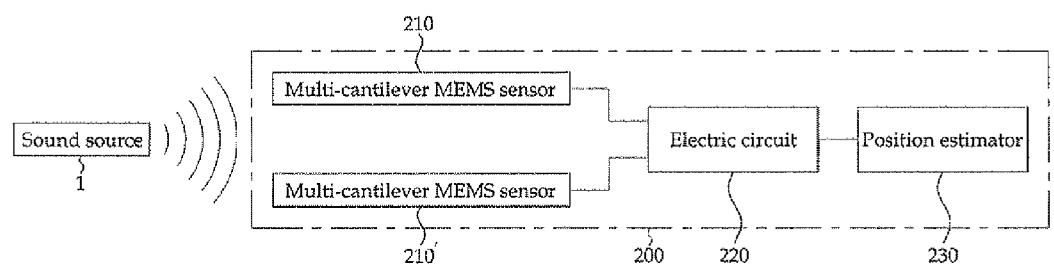
FIG. 4 is a block diagram of a sound source localization apparatus using a multi-cantilever MEMS sensor according to the present invention.

Referring to FIG. 4, a sound source localization apparatus 200 includes at least two multi-cantilever MEMS sensors 210 and 210', an electric circuit 220 and a position estimator 230.

Each of the multi-cantilever MEMS sensors 210 and 210' includes a plurality of cantilevers 100 that vibrate according to voiced sounds and functions as a mechanical filter. Free ends of the plurality of cantilevers 100 of the multi-cantilever MEMS sensor 210 have different lengths, and thus the cantilevers have different resonant frequency bands. Accordingly, the pitch frequency of a sound generated from a sound source 1, that is, a voiced sound, is included in the resonant frequency band of one of the plurality of cantilevers 100. In the present invention, the cantilever having the resonant frequency band including the pitch frequency of the voiced sound generated from the sound source 1 is referred to as "corresponding cantilever 100n'.

Even when the voiced sound generated from the sound source 1 has a different pitch frequency, the sound source 1 can be localized by using the corresponding cantilever 100n having a resonant frequency band that considerably reacts to the pitch frequency of the voiced sound among the plurality of cantilevers 100a, 100b, . . . , 100h having different resonant frequency bands.

More specifically, a sound signal, particularly, a voiced sound consists of a pitch frequency (basic frequency) and a harmonic component corresponding to an integer multiple of the pitch frequency. This voiced signal provisionally vibrates the corresponding cantilever 100n and the corresponding cantilever 100n remarkably vibrates. The vibration of the corresponding cantilever 100n is output as a predetermined signal according to the piezoresistor 20.

The operation of the sound source localization apparatus 200 is explained for the corresponding cantilever 100n of the multi-cantilever MEMS sensor 210 and the corresponding cantilever 100n' of the multi-cantilever MEMS sensor 210' for convenience of explanation.

The electric circuit 220 processes signals generated from corresponding cantilevers 100n and 100n' having the same length among cantilevers included in the multi-cantilever MEMS sensors 210 and 210' to count a TDOA (Time Delay of Arrival) between the multi-cantilever MEMS sensors 210 and 210'.

Figure 6:
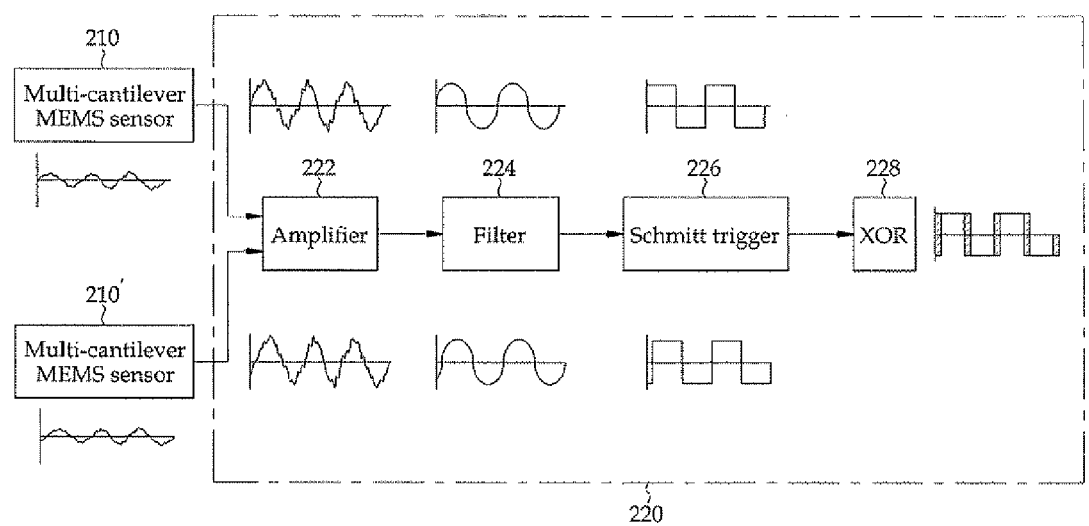
FIG. 6 illustrates a signal processing flow of the sound source localization apparatus using a multi-cantilever MEMS sensor according to the present invention.

Preferably, the electric circuit 220 includes a trigger 226 for rectifying the signals into square-wave signals in order to easily extract the TDOA, a signal amplifier 222 for amplifying signals generated according to the piezoresistors 20 to a predetermined level and a filter 224 (for example, a low pass filter) for removing noise from the amplified signals, as illustrated in FIG. 6.

Furthermore, the electric circuit 220 compensates a phase difference between the multi-cantilever MEMS sensors 210 and 210' in order to correct errors in length and thickness differences between the corresponding cantilevers 100n and 100n' of the multi-cantilever MEMS sensors 210 and 210' to improve the accuracy of sound source localization. Phase difference compensation will be described in detail later in a sound source location method using a multi-cantilever MEMS sensor.

The position estimator 230 localizes the position of sound source 1 based on the counted TDOA.

<Sound Source Localization Method Using Multi-Cantilever MEMS Sensors>

Figure 5:
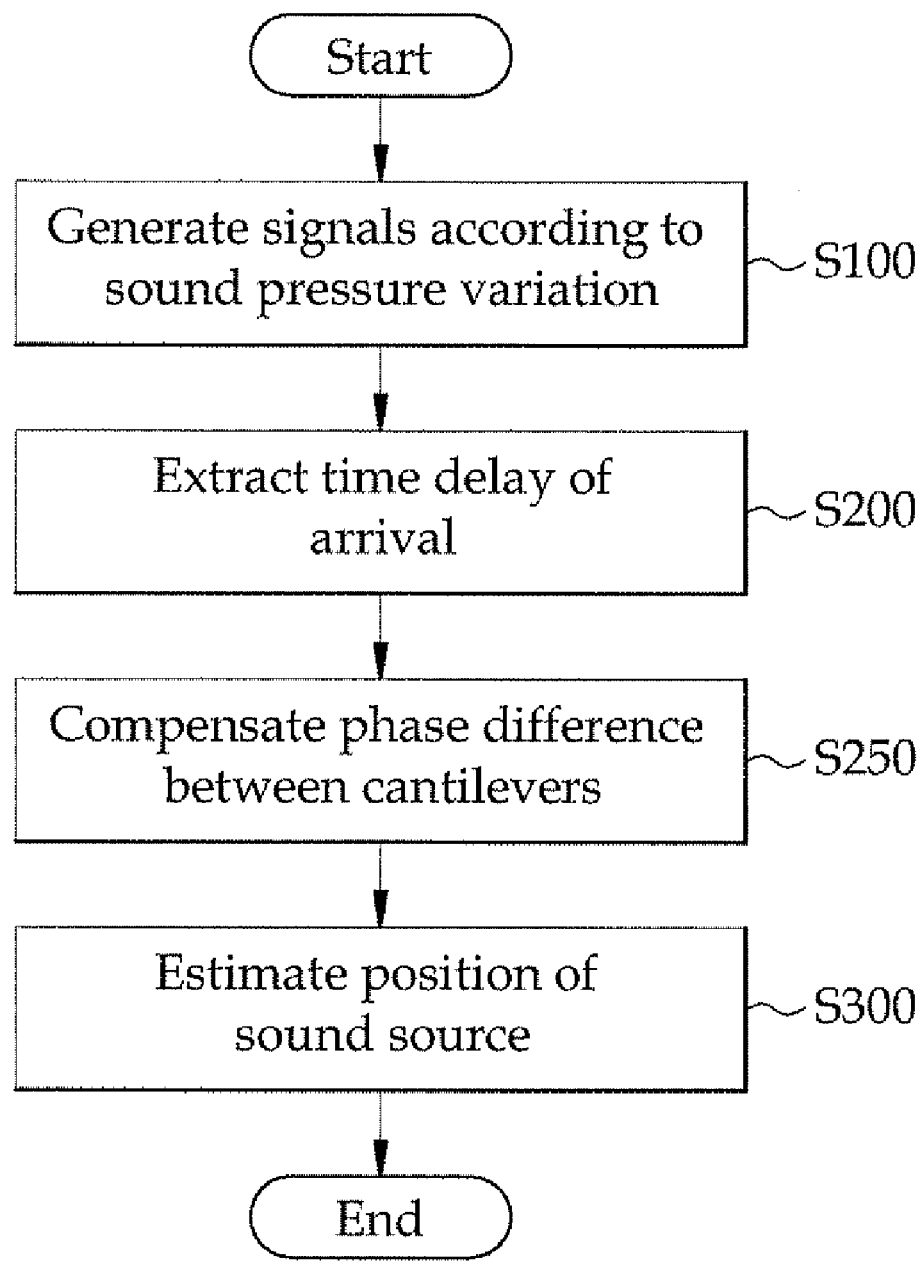
FIG. 5 is a flow chart of a method of using the multi-cantilever MEMS sensor according to the present invention.

A sound source localization method using multi-cantilever MEMS sensors uses at least two multi-cantilever MEMS sensors 210 and 210'. Referring to FIG. 5, the sound source localization method includes a signal generating step S100 in which corresponding cantilevers 100n and 100n' among a plurality of cantilevers 100 of the multi-cantilever MEMS sensors 210 and 210' generate signals according to a sound pressure variation, a TDOA extracting step S200 in which the electric circuit 220 processes the signals to extract a TDOA, and a localization step S300 of localizing the position of sound source 1 from the TDOA.

In the signal generating step S100, when the pitch frequency of a voice corresponds to the resonant frequency bands of the cantilevers 100n and 100n' of the multi-cantilever MEMS sensors 210 and 210', a sound pressure variation of the voice vibrates the cantilevers 100n and 100n'. Vibrations of the cantilevers 100n and 100n' are transferred to predetermined signals according to the piezoresistors 20 of the multi-cantilever MEMS sensors 210 and 210' and detected as predetermined signals according to the sensing parts 30 and 30' and the terminals T and T' of the multi-cantilever MEMS sensors 210 and 210'.

Then, the TDOA extracting step S200 is described. FIG. 6 illustrates a signal processing flow of the electric circuit 220 and signals processed by the electric circuit 220. Signals generated from the corresponding cantilevers 100n and 100n' of the multi-cantilever MEMS sensors 210 and 210' are processed into square-wave signals by the trigger 226, preferably, Schmitt trigger, in order to easily extract a TDOA. Prior to being processed into the square-wave signals, the signals can be amplified by the amplifier 222 or filtered by the filter 224 to remove noise. An XOR operation is performed on the square-wave signals according to an XOR operation unit 228. Finally, counting is performed to estimate TDOA by using the suitable oscillator as illustrated in FIG. 6.

In an embodiment of the present invention, if the corresponding cantilevers 100n and 100n' of the multi-cantilever MEMS sensors 210 and 210' have the same length and thickness and have little error in the manufacturing process thereof (if a manufacturing error is ignorably small), the corresponding cantilevers 100n and 100n' have the same natural frequency. In this case, when the corresponding cantilevers 100n and 100n' generate vibrations, a phase difference between signals generated according to the vibrations is negligible.

Then, a TDOA can be counted from the signals obtained from the corresponding cantilevers 100n and 100n' having the same length and the position of sound source 1 can be localized from the counted TDOA. That is, though phase difference compensation is not required when a phase difference is negligibly small as described above, it is preferable to add a TDOA compensation step S250 in order to improve measurement accuracy if an error in the lengths or/and thicknesses of the corresponding cantilevers 100n and 100n is not ignorable.

That is, the TDOA compensation step S250 compensates a phase difference caused by an error in the lengths or/and thicknesses of the corresponding cantilevers 100n and 100n' of the multi-cantilever MEMS sensors 210 and 210'. The TDOA is compensated in such a manner that a phase difference between the corresponding cantilevers 100n and 100n' of the multi-cantilever MEMS sensors 210 and 210' is previously stored in a database and the phase difference is subtracted from or added to the counted TDOA which has been subjected to the TDOA extracting step S200. This is described in more detail with reference to FIGS. 7a, 7b and 7c.

Figure 7A:
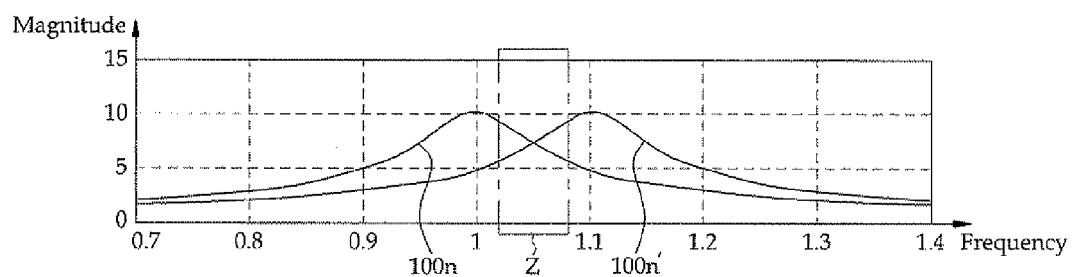
FIG. 7a is a graph illustrating magnitude response according to frequencies of corresponding cantilevers of two multi-cantilever MEMS sensors.

FIG. 7a illustrates magnitude response of the corresponding cantilevers 100n and 100n' of the two multi-cantilever MEMS sensors. In FIG. 7a, x-axis represents a frequency (kHz) and y-axis represents a predetermined physical magnitude (pressure, voltage and the like). It can be known from FIG. 7a that the corresponding cantilevers 100n and 100n' have different resonant frequency bands as illustrated in a region Z due to an error in the thicknesses or lengths of the corresponding cantilevers 100n and 100n'.

Figure 7B:
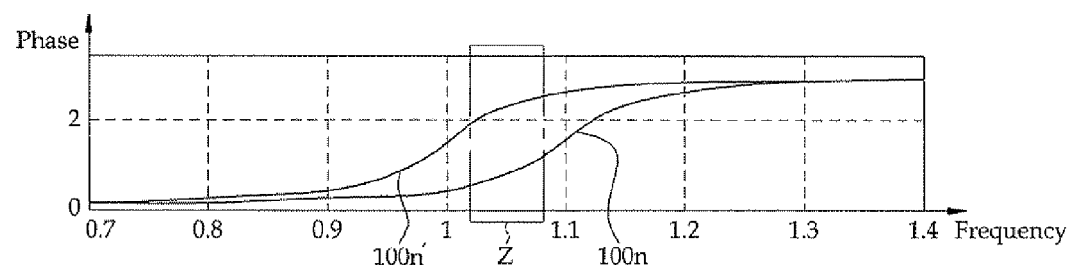
FIG. 7b is a graph illustrating phase response according to frequencies of corresponding cantilevers of two multi-cantilever MEMS sensors.
Figure 7C:
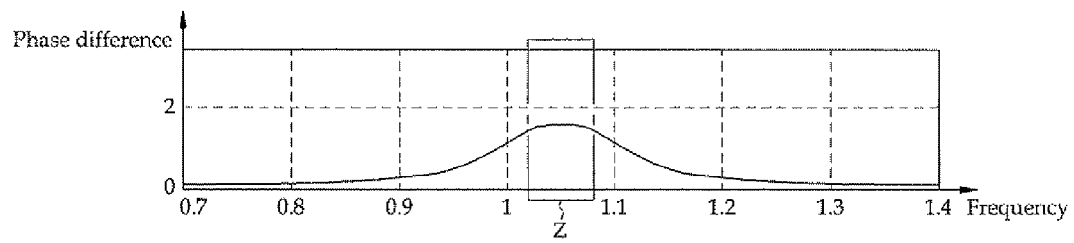
FIG. 7c is a graph illustrating a phase difference according to frequencies of corresponding cantilevers of two multi-cantilever MEMS sensors.

FIG. 7b is a graph illustrating the phase response of the corresponding cantilevers 100n and 100n' with respect to frequency and FIG. 7c is a graph illustrating a phase difference between the corresponding cantilevers 100n and 100n' with respect to frequency. In FIGS. 7b and 7c, x-axis represents a frequency and y-axis represents a phase. As illustrated in FIG. 7c, a phase difference between the corresponding cantilevers 100n and 100n' is not a constant, and thus a compensation value must be determined by taking mean value of phase difference of desired frequency band (mean value of boxed area). Accordingly, it is preferable that the phase difference is previously stored in the electric circuit 220 or the position estimator 230 as a database.

Finally, the sound source localization step S300 localizes the position of sound source 1 based on the counted TDOA (S300). Sound source localization from the TDOA is well known in the art so that detailed explanation thereof is omitted.

Modified Embodiment

In another embodiment, the multi-cantilever MEMS sensor according to the present invention functions as a mechanical sensor and it can be applied to any industrial field using a conventional sound source localization algorithm operating based on a DSP. In particular, the multi-cantilever MEMS sensor according to the present invention can be used for a human-robot interaction which people are increasingly interested worldwide.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A sound source localization apparatus comprising:
   at least two multi-cantilever MEMS sensors, each comprising
   - a plurality of cantilevers each of which includes a piezoresistor and a sensing part for sensing a predetermined signal generated according to the piezoresistor, and
   - a terminal for detecting the signal generated according to the piezoresistor, wherein one end of each cantilever is a free end and the other end thereof is a fixed end of each cantilever, the piezoresistor and the sensing part are formed at the fixed end, and the free ends of the plurality of cantilevers have different lengths;

an electric circuit for detecting signals generated from corresponding cantilevers of the multi-cantilever MEMS sensors and counting a TDOA from a sound source to the at least two multi-cantilever MEMS sensors; and a position estimator for localizing the sound source position from the TDOA;

the electric circuit comprising
   - a signal amplifier for amplifying the signals generated from the corresponding cantilevers of the at least two multi-cantilever MEMS sensors to a predetermined level,
   - a filter for removing noise from the amplified signals, and
   - a trigger for processing the noise-free signals into square-wave signals.

2. The sound source localization apparatus according to claim 1, wherein the piezoresistor comprises boron.

* * * * *